US012480821B2

(12) United States Patent
Chang et al.

(10) Patent No.: US 12,480,821 B2
(45) Date of Patent: Nov. 25, 2025

(54) TEMPERATURE SENSOR FOR DUAL INLINE MEMORY MODULES (DIMM)

(71) Applicant: Dell Products L.P., Round Rock, TX (US)

(72) Inventors: Shan-Yi Chang, Taoyuan (TW); Shun-Cheng Hsu, Hsinchu (TW); Chien-Tung Huang, New Taipei (TW)

(73) Assignee: Dell Products L.P., Round Rock, TX (US)

( * ) Notice: Subject to any disclaimer, the term of this patent is extended or adjusted under 35 U.S.C. 154(b) by 370 days.

(21) Appl. No.: 18/198,892

(22) Filed: May 18, 2023

(65) Prior Publication Data

US 2024/0385054 A1 Nov. 21, 2024

(51) Int. Cl.
*G01K 3/00* (2006.01)
*G01K 1/14* (2021.01)
(52) U.S. Cl.
CPC ............ *G01K 3/005* (2013.01); *G01K 1/14* (2013.01)

(58) Field of Classification Search
CPC ............... H05K 1/0284; H05K 1/185; H05K 2201/041; H05K 7/205; H05K 1/0278; H05K 5/0086; H01L 2224/16225; H01L 2224/32225; H01L 2224/73204; H01L 2924/00; H01L 2924/19105; H01L 2224/16145; H01L 2224/48091; H01L 2924/00014; H01Q 1/245; H01Q 1/44
See application file for complete search history.

(56) References Cited

U.S. PATENT DOCUMENTS

2022/0003511 A1* 1/2022 Embleton ............... B32B 3/30

* cited by examiner

*Primary Examiner* — Thong Q Le
(74) *Attorney, Agent, or Firm* — Terrile, Cannatti & Chambers, LLP; Emmanuel A. Rivera

(57) ABSTRACT

Described herein is a temperature sensing module for determining and adjusting temperature of dual inline memory module (DIMM) of an information handling system. The temperature sensing module includes a flexible printed circuit (FPC) and a temperature sensor integrated into the FPC. The temperature sensor is configured to contact and receive temperature the DIMM. The received temperature is used to adjust temperature of the DIM by heating a heating pad. Fasteners are to connect the temperature sensing module to the DIMM.

19 Claims, 5 Drawing Sheets

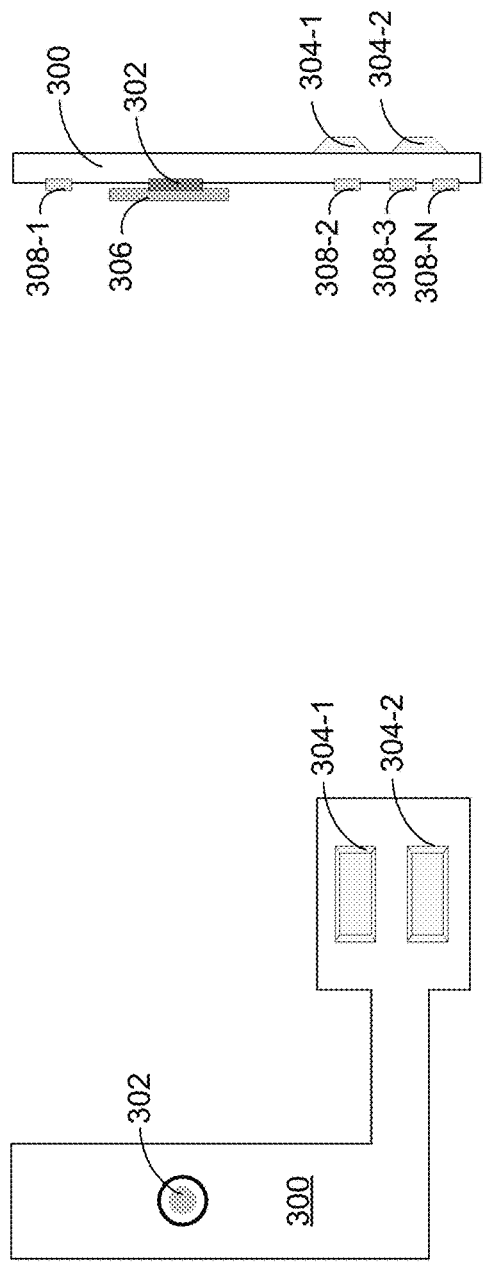
*Figure 3A*
*Figure 3B*
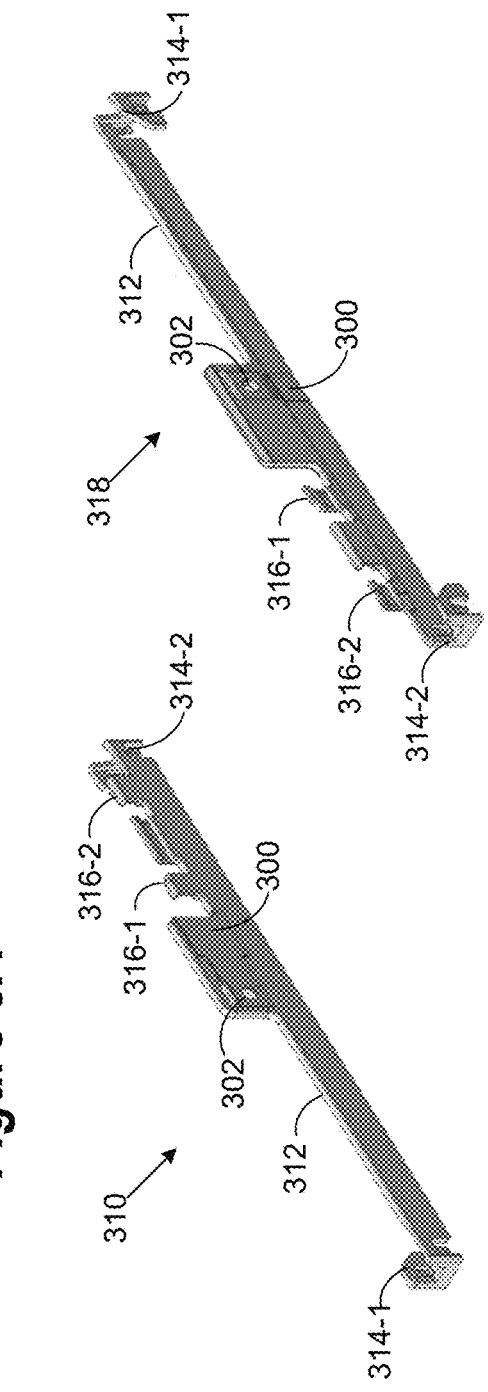
*Figure 3C*

TEMPERATURE SENSOR FOR DUAL INLINE MEMORY MODULES (DIMM)

BACKGROUND OF THE INVENTION

Field of the Invention

The present invention relates to information handling systems. More specifically, embodiments of the invention provide a system and method for measuring and adjusting temperature of dual inline memory modules (DIMM) of information handling systems.

Description of the Related Art

As the value and use of information continues to increase, individuals and businesses seek additional ways to process and store information. One option available to users is information handling systems. Information handling systems include personal computers (PC), server computers, desktop computers, notebooks, laptops, etc. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems incorporate the use of dual inline memory modules or DIMMs are incorporated. A DIMM is a series of dynamic random-access memory (DRAM) integrated circuits that hold memory modules (i.e., RAM). DIMMs operate at certain temperatures. An information handling system may operate at extreme temperatures (e.g., −40° C. to 65° C.). Accurately monitoring and reporting the temperature at the DIMMs is desirable to assure proper operation of the DIMMs and the information handling system. Furthermore, when the information handling system powers/boots up, getting the DIMMs to operating temperature allows the information handling system to become operational sooner.

SUMMARY OF THE INVENTION

A temperature sensing module for determining and adjusting dual inline memory module (DIMM) temperature comprising a flexible printed circuit (FPC); a temperature sensor integrated into the FPC, wherein the temperature sensor is configured to contact and receive temperature the DIMM, wherein received temperature is used to adjust temperature of the DIMM; and one or more fasteners to connect the temperature sensing module to the DIMM.

A computer-implementable method and computer-readable storage medium for sensing and adjusting the temperature of a DIMM comprising collecting temperature data of a DIMM upon information handling system power on; determining if the collected temperature data is within operating temperature of the DIMM; and adjusting the heat of a heating pad until collected temperature data is within the operating temperature of the DIMM.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIG. 3A is a top view of a flexible printed circuit with a temperature sensor;

FIG. 3B is a side view of a flexible printed circuit with a temperature sensor;

FIG. 3C are isometric views of a temperature sensing module;

DETAILED DESCRIPTION

Implementations provide for a temperature sensing module that can be inserted into existing dual inline memory modules (DIMM) sockets of an information handling system. The temperature sensing module includes a flexible printed circuit (FPC) and temperature sensor that contacts DIMMs, and fasteners. Temperature data of the DIMM is collected. A heating pad under the DIMM sockets can be initiated to heat the DIMMs to operating temperature.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a microphone, keyboard, a video display, a mouse, etc. The information handling system may also include one or more buses operable to transmit communications between the various hardware components.

Figure 1:
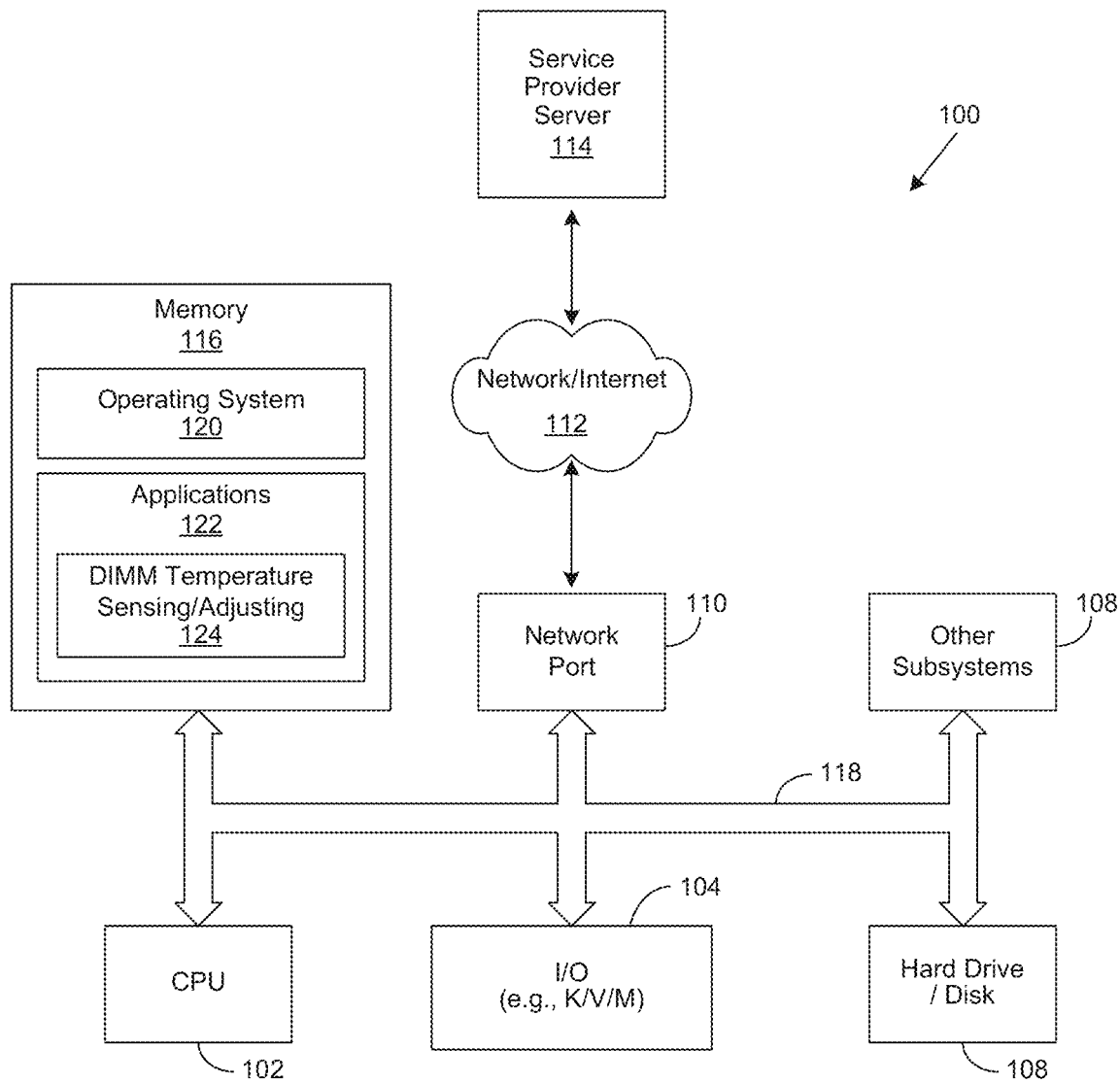
FIG. 1 is a general illustration of an information handling system to implement the system and method of the present invention.

FIG. 1 is a generalized illustration of an information handling system 100 that can be used to implement the system and method of the present invention. The information handling system 100 can be implemented as a computing device, such as a laptop computer, desktop computer, etc.

The information handling system 100 includes a processor (e.g., central processor unit or "CPU") 102. Implementations further provide for other processors and controllers, including application specific controllers (e.g., memory controller). The information handling system 100 includes input/output (I/O) devices 104, such as a microphone, a keyboard, a video/display, a mouse, and associated controllers (e.g., K/V/M).

The information handling system 100 includes a hard drive or disk storage 106, and various other subsystems 108. In various embodiments, the information handling system 100 also includes network port 110 operable to connect to a network 112 described herein, where network 112 can include one or more wired and wireless networks, including the Internet. Network 112 is likewise accessible by a service provider server 114.

The information handling system 100 likewise includes system memory 116, which is interconnected to the foregoing via one or more buses 118. System memory 116 can be implemented as hardware, firmware, software, or a combination of such (e.g., RAM, ROM, DIMM, etc.).

System memory 116 further includes an operating system (OS) 120. Embodiments provide for the system memory 116 to include applications 122. Applications 122 can be implemented as software or firmware, and can be downloaded or preprogrammed. Implementations provide for a DIMM temperature sensing and adjusting application 124 further described herein.

Figure 2:
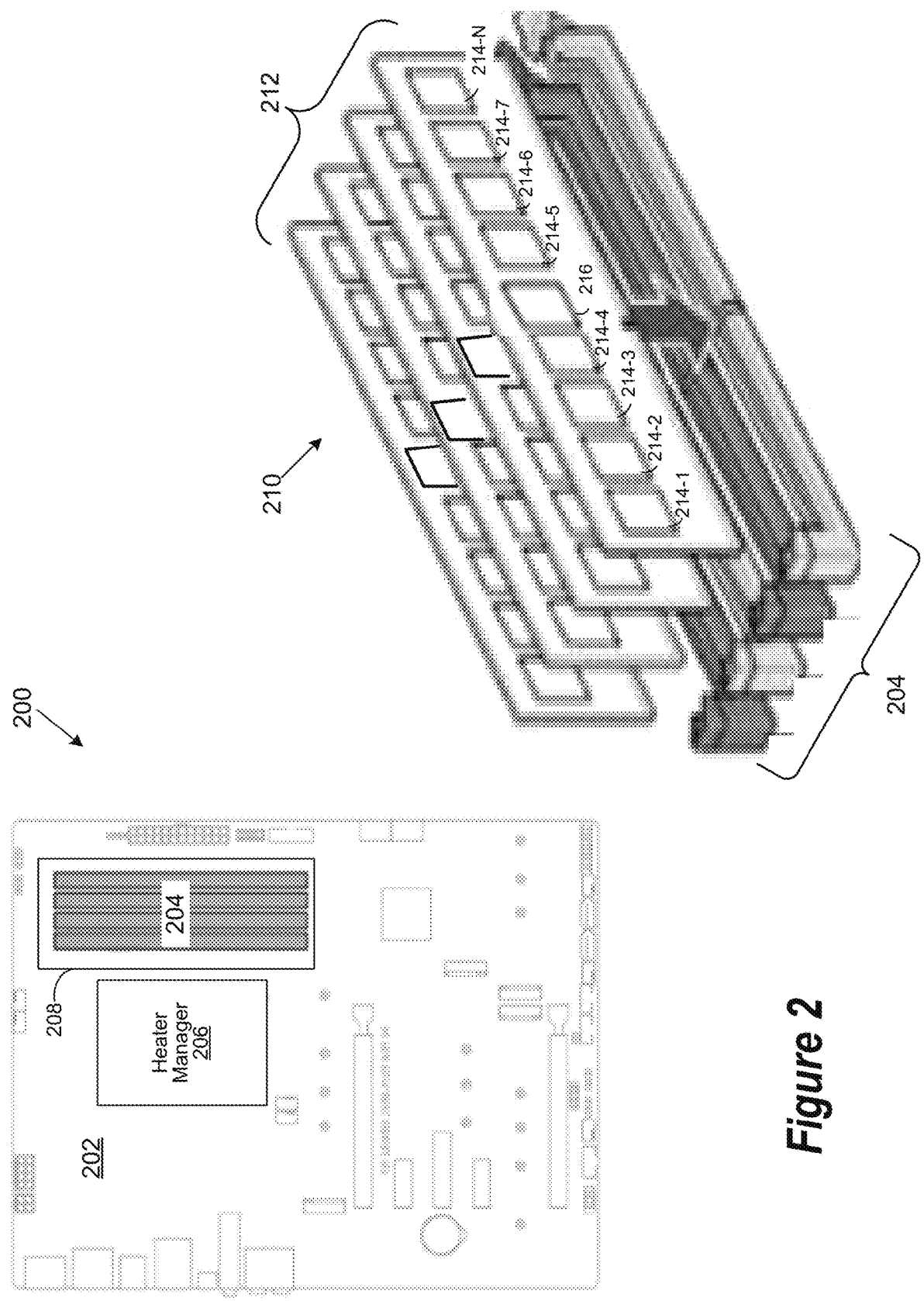
FIG. 2 illustrates a motherboard, dual inline memory modules (DIMM) sockets, and DIMMs.

FIG. 2 shows a motherboard, DIMM sockets, and DIMMs. 200 shows a top level view. Implementations provide for the information handling system 100 described in FIG. 1 to include a motherboard 202, which can include various components and communication paths (e.g., busses). In particular, the motherboard 202 includes one or more DIMM sockets 204 that are connected to other components on the motherboard 202 and information handling system 100.

In certain implementations, the motherboard 202 can include a heater manager 206 which collects temperature data from a temperature sensor of a temperature sensing module as further described herein. Implementations provide for the heater manager 206 to be configured as a chipset. In operation, when an information handling system 100 is powered on/activated, temperature data is collected and sent to the heater manager 206. The heater manager 206 determines if the received temperature data is within the operating temperature of the DIMM(s), and can activate and control a heating pad 208 to provide the necessary temperature to the DIMM(s). Implementations provide for the heating pad 208 to be placed under the DIMM sockets 204.

In certain implementations, DIMM temperature sensing and adjusting application 124 described in FIG. 1 receives temperature data and activates and controls the heating pad 208 to provide the necessary temperature to the DIMM(s).

210 is an isometric view of DIMM sockets and DIMMs. The DIMM sockets 204 are configured to receive one or more DIMMs 212. A dual inline memory module or DIMM (DIMM 212) is also referred to a RAM (random access memory) stick, and is configured in a standardized form factor to be fitted into DIMM sockets 204. A DIMM 212 includes a series of RAM integrated circuits 214-1 to 214-N.

A DIMM 212 includes a registered clock driver (RCD) chip 216. RCD chip 216 receives instructions or commands from the CPU (e.g., processor 102) before the instructions or commands are sent to RAM ICs 214. Although DIMM vendors can provide different layouts of RAM ICs 214, industry standards provided that the RCD chip 216 be located in the same location regardless of the layout of the RAM ICs 214 in order to provided/receive instructions or commands. As will be discussed, placement of a temperature sensor will be approximate to the location of the RCD chip 216 to support different DIMM 212 layouts. Therefore, placement of the temperature sensor allows the ability to support different DIMM layout configurations.

FIG. 3A shows a top view of a flexible printed circuit (FPC) 300 with a temperature sensor 302. The temperature sensor 302 is integrated onto the FPC 300. The FPC 300 is configured to be affixed to a temperature sensing module. In certain embodiments, the FPC 300 can include spacers 304-1 and 304-2.

FIG. 3B shows a side view of the FPC 300 with temperature sensor 302. Implementations provide for an absorbent material, such as a sponge 306 to be attached to the temperate sensor 302. An adhesive side with adhesives 308 may be implemented on the FPC 300.

FIG. 3C is isometric views of a temperature sensing module. 310 is a front side isometric view of a temperature sensing module 312 for DIMMs 212. The FPC 300 using adhesives 308 is attached to the temperature sensing module 312 FPC 300. Temperature sensor 302 is placed, such that it is located near RCD chip 216 (not shown) of a DIMM 212 (not shown).

Implementations provide for the temperature sensing module 312 to include connectors 314-1 and 314-2 to connect the temperature sensing module 312 to a DIMM socket 204.

Fasteners 316-1 and 316-2 can be implemented to connect the FPC 300 and temperature sensor 302 to a DIMM 212, and are configured to support different DIMMs 212. The fasteners 316-1 and 316-2 can be constructed with an elastic material, such as nylon, to absorb tolerance variations accommodating different DIMMs 212, such as those with different chipset heights. Fasteners 316-1 and 316-2 provide that the FPC 300 and temperature sensor 302 contact the DIMM 312 tightly, yet allow the DIMM 212 to be installed and removed without damage from DIMM sockets 204.

318 is a front side isometric view of a temperature sensing module 312 for DIMMs 212. 318 illustrates the different elements as laid out in an implementation.

Figure 4:
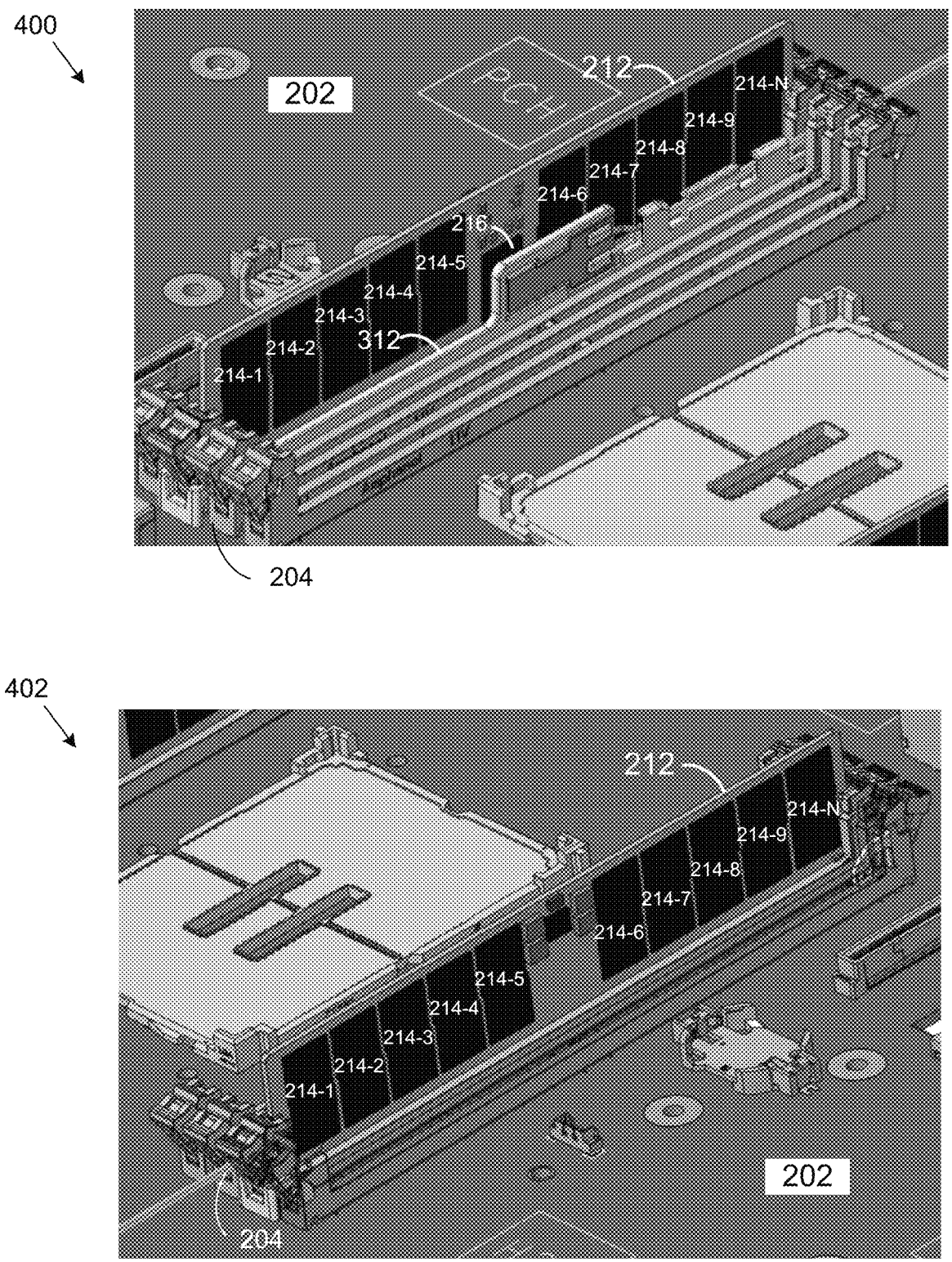
FIG. 4 illustrates placement of a temperature sensing module in a DIMM socket.

FIG. 4 shows isometric views as to placement of a temperature sensing module 312 in a DIMM socket 204. 400 is a front side view showing the temperature sensing module 312 installed on DIMM socket 204. The temperature sensing module 312 is installed such as the height of the temperature sensing module 312 allows temperature sensor 302 to be located next to RCD chip 216 of DIMM 212. 410 is a backside view showing the temperature sensing module 312 installed on DIMM socket 204.

Figure 5:
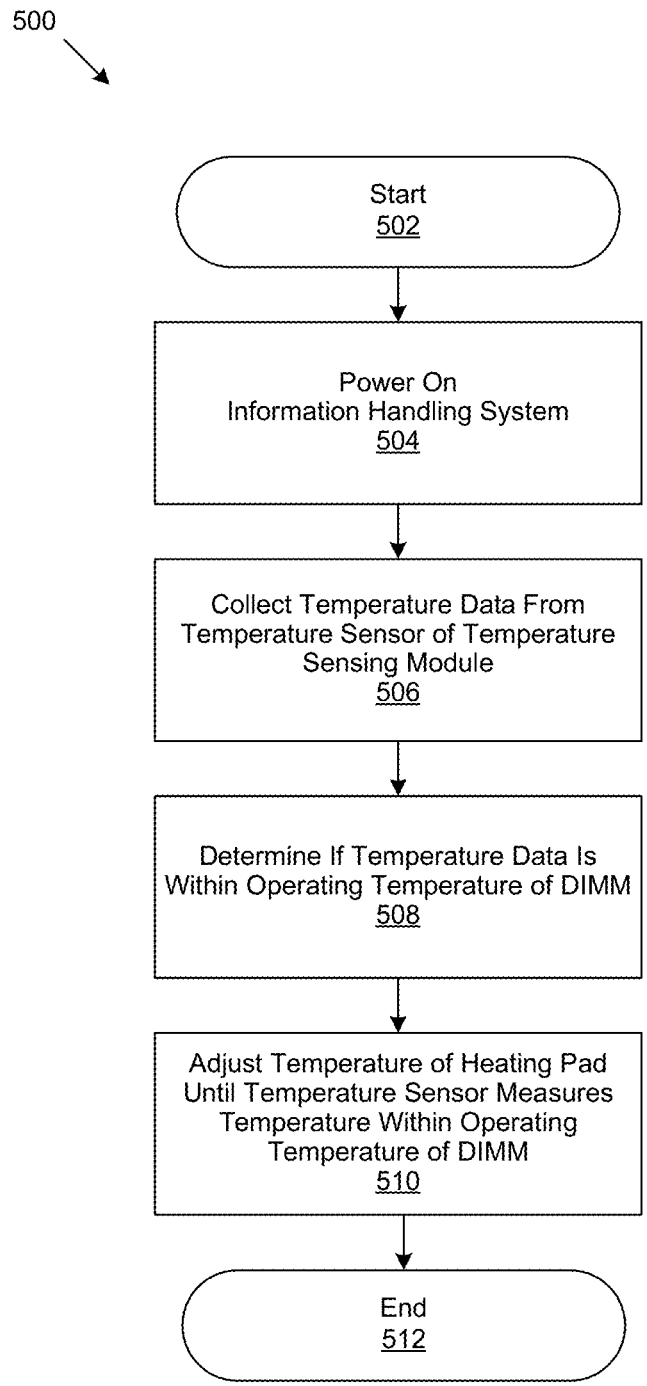
FIG. 5 is a generalized flowchart for sensing and adjusting temperature of DIMMs of an information handling system.

FIG. 5 is a generalized flowchart 500 for sensing and adjusting the temperature of DIMMs 212 of an information handling system 100. Implementations provide for the DIMM temperature sensing and adjusting application 124 to perform the steps of process 500. The order in which the method is described is not intended to be construed as a limitation, and any number of the described method steps may be combined in any order to implement the method, or alternate method. Additionally, individual steps may be deleted from the method without departing from the spirit and scope of the subject matter described herein. Furthermore, the method may be implemented in any suitable hardware, software, firmware, or a combination thereof, without departing from the scope of the invention.

At step 502 the process 500 starts. At step 504, the information handling system 100 is powered on. At step 506, upon power on of the temperature handling system 100, temperature data is collected from temperature sensor 302 of the temperature sensing module 312. At step 508, a determination is performed from the collected temperature data is within operating temperature of DIMMs 212. At step 510, if it is determined that the collected temperature data is not within the operating temperature of DIMMs 212, the heating pad 208 is instructed to heat up until the temperature sensor 302 provides temperature data within operating temperature of DIMMs 212. At step 510, the process 500 ends.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a microphone, keyboard, a video display, a mouse, etc. The information handling system may also include one or more buses operable to transmit communications between the various hardware components.

As will be appreciated by one skilled in the art, the present invention may be embodied as a method, system, or computer program product. Accordingly, embodiments of the invention may be implemented entirely in hardware, entirely in software (including firmware, resident software, microcode, etc.) or in an embodiment combining software and hardware. These various embodiments may all generally be referred to herein as a "circuit," "module," or "system." Furthermore, the present invention may take the form of a computer program product on a computer-usable storage medium having computer-usable program code embodied in the medium.

Any suitable computer usable or computer readable medium may be utilized. The computer-usable or computer-readable medium may be, for example, but not limited to, an electronic, magnetic, optical, electromagnetic, infrared, or semiconductor system, apparatus, or device. More specific examples (a non-exhaustive list) of the computer-readable medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, or a magnetic storage device. In the context of this document, a computer-usable or computer-readable medium may be any medium that can contain, store, communicate, or transport the program for use by or in connection with the instruction execution system, apparatus, or device.

Computer program code for carrying out operations of the present invention may be written in an object-oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

Embodiments of the invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer \implemented process such that the instructions which execute on the computer or other programmable apparatus provide steps for implementing the functions/acts specified in the flowchart and/or block diagram block or blocks.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only and are not exhaustive of the scope of the invention.

Skilled practitioners of the art will recognize that many such embodiments are possible, and the foregoing is not intended to limit the spirit, scope or intent of the invention. Consequently, the invention is intended to be limited only by the spirit and scope of the appended claims, giving full cognizance to equivalents in all respects.

What is claimed is:

1. A temperature sensing module for determining and adjusting dual inline memory module (DIMM) temperature comprising:
   a flexible printed circuit (FPC);
   a temperature sensor integrated into the FPC, wherein the temperature sensor is configured to contact and receive temperature information of the DIMM, wherein the received temperature is used to adjust temperature of the DIMM, wherein the temperature sensor is placed near a registered clock driver (RCD) chip of the DIMM; and
   one or more fasteners to connect the temperature sensing module to the DIMM.

2. The temperature sensing module of claim 1, wherein the temperature sensing module is placed in a DIMM socket next to the DIMM.

3. The temperature sensing module of claim 1, wherein the temperature sensing module is configured to support different DIMM layout configurations.

4. The temperature sensing module of claim 1, wherein the fasteners are constructed of a flexible material to allow the temperature sending module to attach to different DIMMs.

5. The temperature sensing module of claim 1, wherein a heating pad under the DIMM is heated to bring the DIMM to operating temperature if the received temperature is not within operating temperature of the DIMM.

6. The temperature sensing module of claim 5, wherein the heating pad is placed under DIMM sockets that receive the DIMM and temperature sensing module.

7. A method for sensing and adjusting the temperature of a DIMM comprising:
   collecting temperature data of a DIMM upon information handling system power on;
   determining if the collected temperature data is within operating temperature of the DIMM; and
   adjusting the heat of a heating pad until collected temperature data is within the operating temperature of the DIMM.

8. The method of claim 7, wherein a temperature sensor of a temperature sensing module provides the temperature data.

9. The method of claim 8, wherein the temperature sensing module is placed in a DIMM socket next to the DIMM.

10. The method of claim 8, wherein the temperature sensor is placed near a registered clock driver (RCD) chip of the DIMM.

11. The method of claim 8, wherein the temperature sensing module is configured to support different DIMM layout configurations.

12. The method of claim 8, wherein fasteners constructed of a flexible material are used to connect the temperature sensing module to the DIMM.

13. The method of claim 8, wherein the heating pad is placed under DIMM sockets which receive the temperature sensing module and DIMM.

14. A non-transitory, computer-readable storage medium embodying computer program code for message serialization and deserialization, the computer program code comprising computer executable instructions configured for sensing and adjusting the temperature of a DIMM comprising:
   collecting temperature data of a DIMM upon information handling system power on;
   determining if the collected temperature data is within operating temperature of the DIMM; and
   adjusting the heat of a heating pad until collected temperature data is within the operating temperature of the DIMM.

15. The non-transitory, computer-readable storage medium of claim 14, wherein a temperature sensor of a temperature sensing module provides the temperature data.

16. The non-transitory, computer-readable storage medium of claim 15, wherein the temperature sensor is placed near a registered clock driver (RCD) chip of the DIMM.

17. The non-transitory, computer-readable storage medium of claim 15, wherein the temperature sensing module is configured to support different DIMM layout configurations.

18. The non-transitory, computer-readable storage medium of claim 15, wherein fasteners constructed of a flexible material are used to connect the temperature sensing module to the DIMM.

19. The non-transitory, computer-readable storage medium of claim 15, wherein the heating pad is placed under DIMM sockets which receive the temperature sensing module and DIMM.

* * * * *